(12) United States Patent
Hazue

(10) Patent No.: US 9,741,739 B2
(45) Date of Patent: Aug. 22, 2017

(54) SEMICONDUCTOR MANUFACTURING METHOD AND SEMICONDUCTOR DEVICE

(71) Applicant: TOSHIBA MEMORY CORPORATION, Minato-ku (JP)

(72) Inventor: Shunsuke Hazue, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/265,028

(22) Filed: Sep. 14, 2016

(65) Prior Publication Data

US 2017/0207237 A1   Jul. 20, 2017

Related U.S. Application Data

(60) Provisional application No. 62/279,110, filed on Jan. 15, 2016.

(51) Int. Cl.
| | |
|---|---|
| *H01L 21/461* | (2006.01) |
| *H01L 27/11582* | (2017.01) |
| *H01L 27/11565* | (2017.01) |
| *H01L 21/768* | (2006.01) |
| *H01L 21/311* | (2006.01) |
| *H01L 21/66* | (2006.01) |

(52) U.S. Cl.
CPC .. *H01L 27/11582* (2013.01); *H01L 21/31116* (2013.01); *H01L 21/31144* (2013.01); *H01L 21/76816* (2013.01); *H01L 22/26* (2013.01); *H01L 27/11565* (2013.01)

(58) Field of Classification Search
CPC ......... H01L 21/31116; H01L 21/31144; H01L 21/76816; H01L 22/26; H01L 27/11565

USPC ........... 438/40, 43, 454, 551, 690, 691, 692
See application file for complete search history.

(56) References Cited

U.S. PATENT DOCUMENTS

| | | | |
|---|---|---|---|
| 8,313,998 B2 | 11/2012 | Satonaka et al. | |
| 8,648,404 B2 | 2/2014 | Ko et al. | |
| 2010/0323505 A1 | 12/2010 | Ishikawa et al. | |
| 2013/0234232 A1 | 9/2013 | Yahashi | |
| 2016/0240549 A1* | 8/2016 | Omura | H01L 27/11582 |

FOREIGN PATENT DOCUMENTS

| | | |
|---|---|---|
| JP | 2011-3722 | 1/2011 |
| JP | 2011-166061 | 8/2011 |
| JP | 2013-4690 | 1/2013 |
| JP | 2013-187200 | 9/2013 |

* cited by examiner

*Primary Examiner* — Tan N Tran
(74) *Attorney, Agent, or Firm* — Oblon, McClelland, Maier & Neustadt, L.L.P.

(57) ABSTRACT

A semiconductor manufacturing method includes alternately stacking first films and second films to form a stack film. The method includes forming a plurality of recessed portions in a stack direction of the stack film at an interval in a first direction substantially perpendicular to the stack direction. The semiconductor manufacturing method includes forming third films in the recessed portions. The method includes forming a mask material on the stack film and the third films and diminishing the mask material to expose the stack film in a first range between an end of a stepped portion to be formed on the stack film and one of the third films and to position an end of the mask material on the third film. The method includes removing a predetermined number of layers of films from the stack film in the first range using the diminished mask material as a mask.

16 Claims, 12 Drawing Sheets

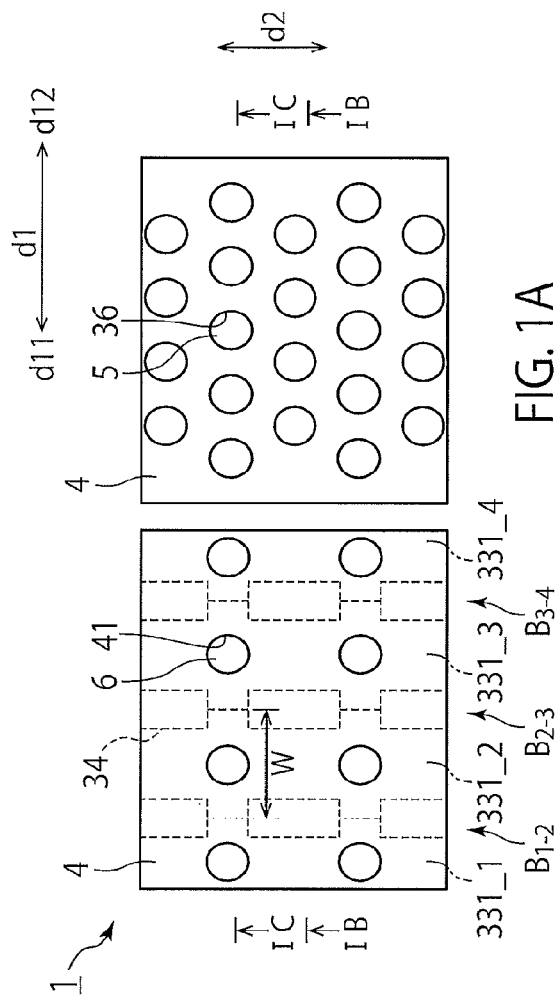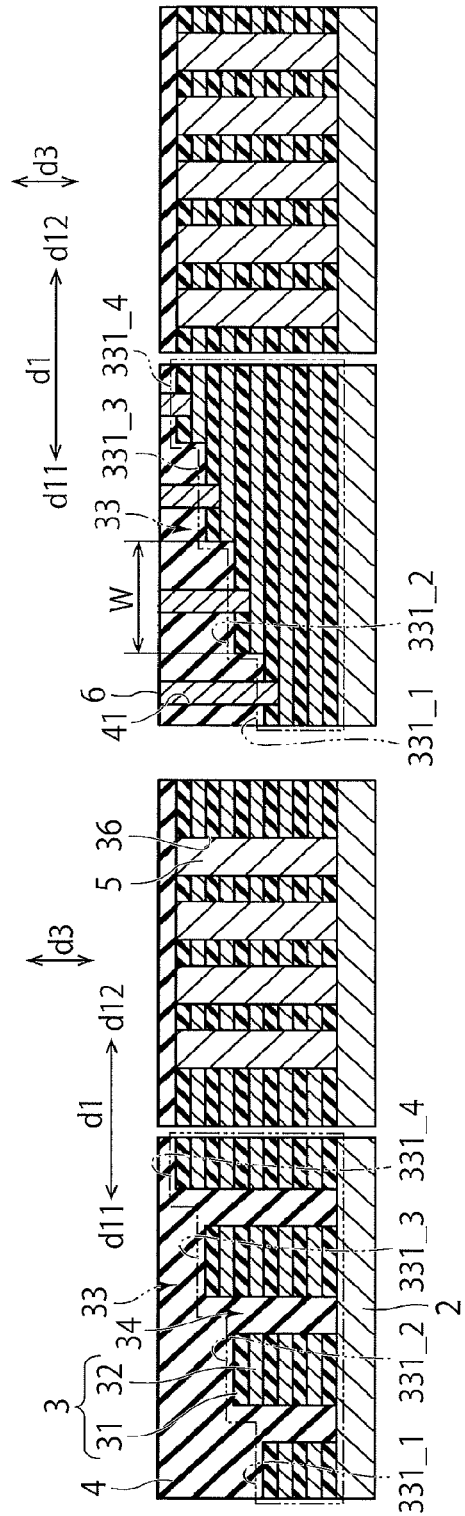
FIG. 1A
FIG. 1B
FIG. 1C

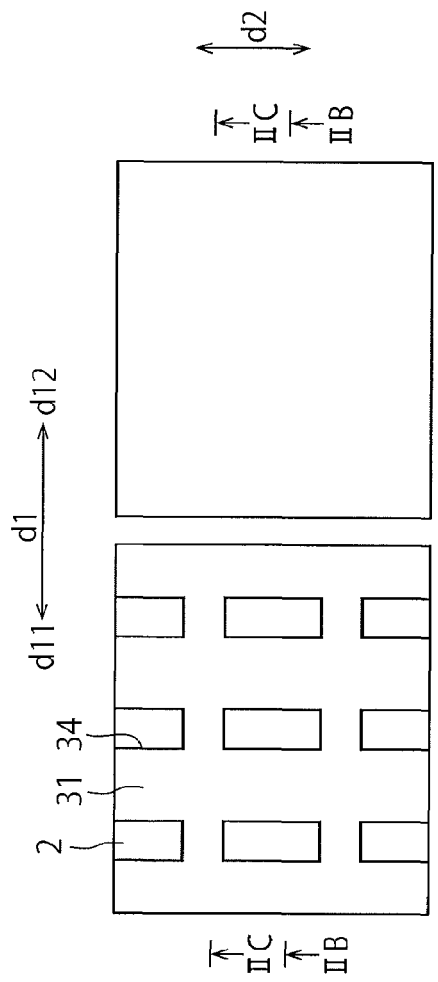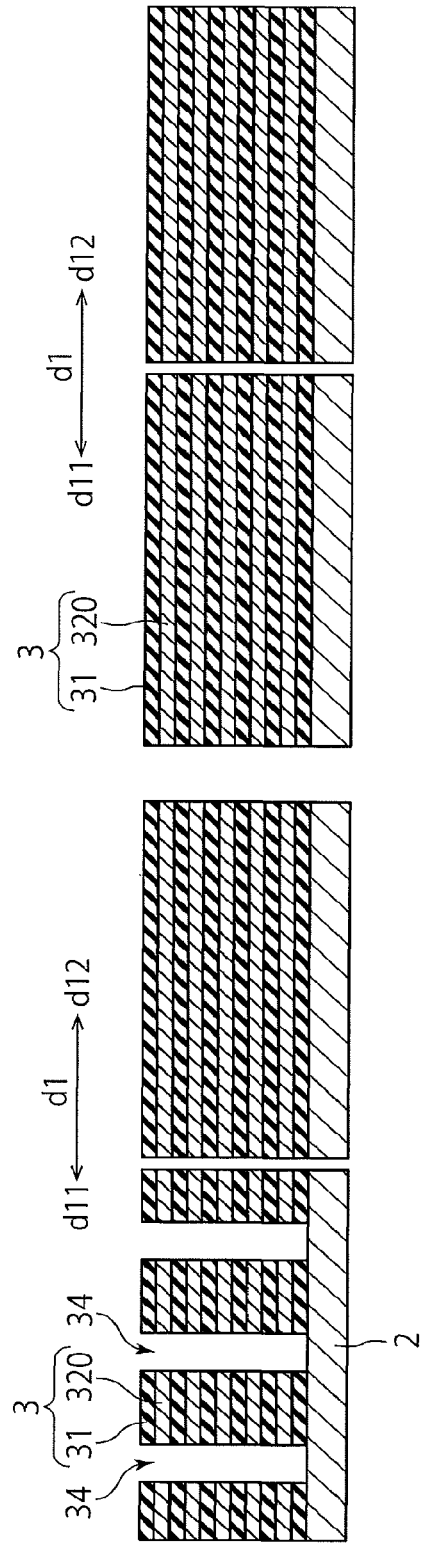
FIG. 2A
FIG. 2B
FIG. 2C

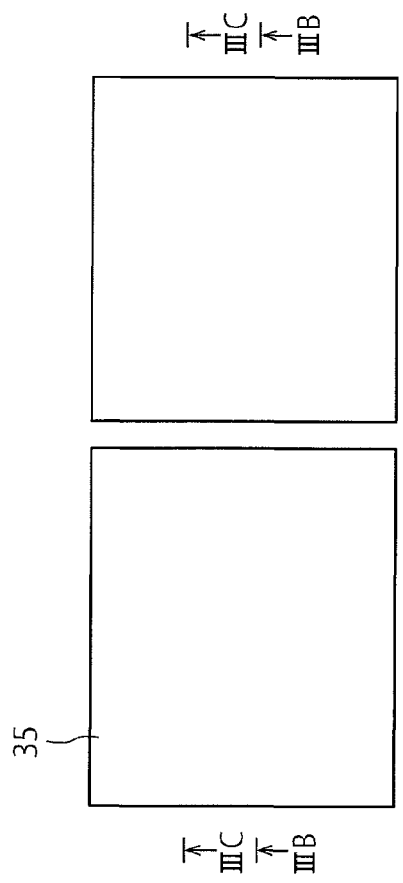
FIG. 3A
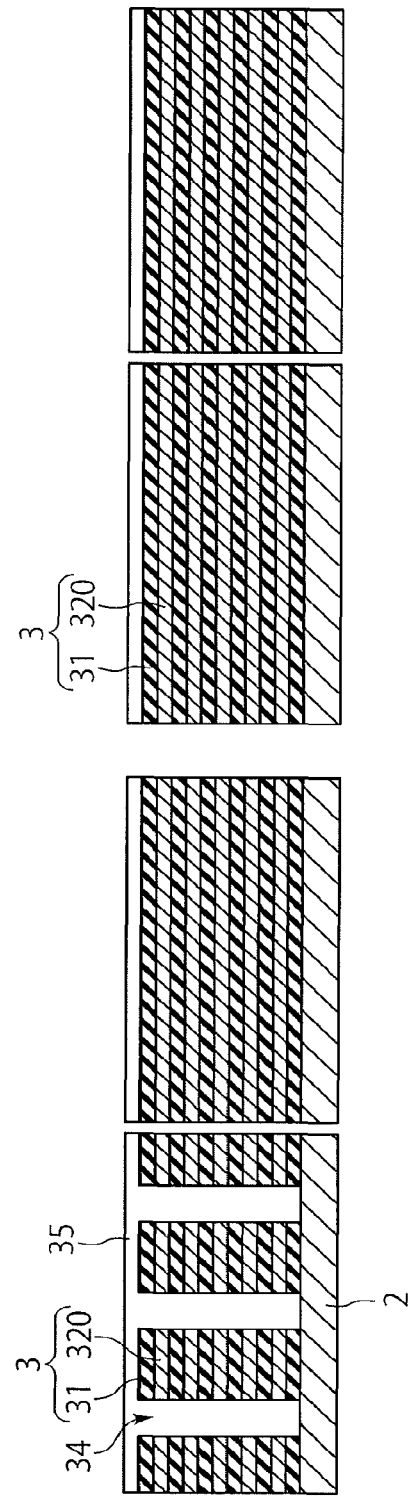
FIG. 3B
FIG. 3C

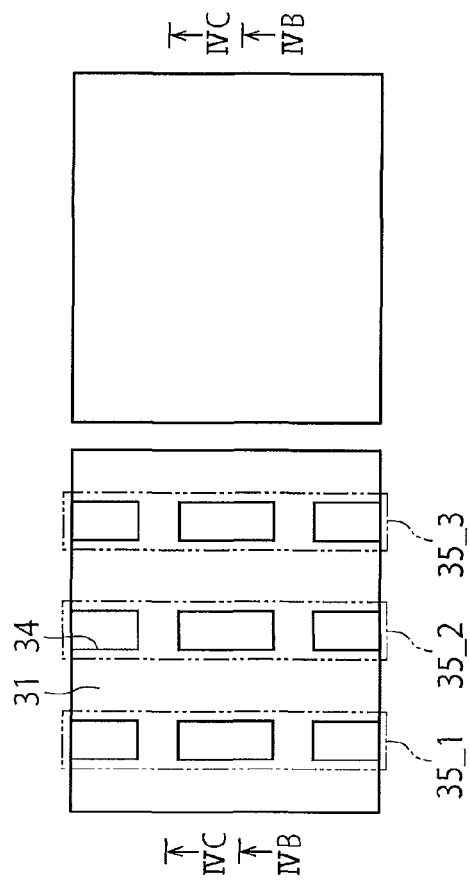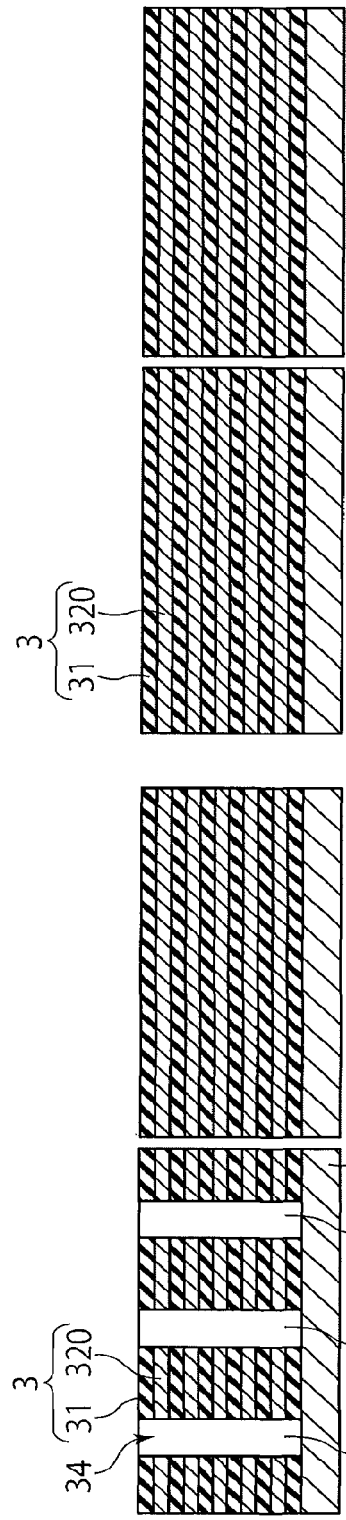
FIG. 4A
FIG. 4B
FIG. 4C

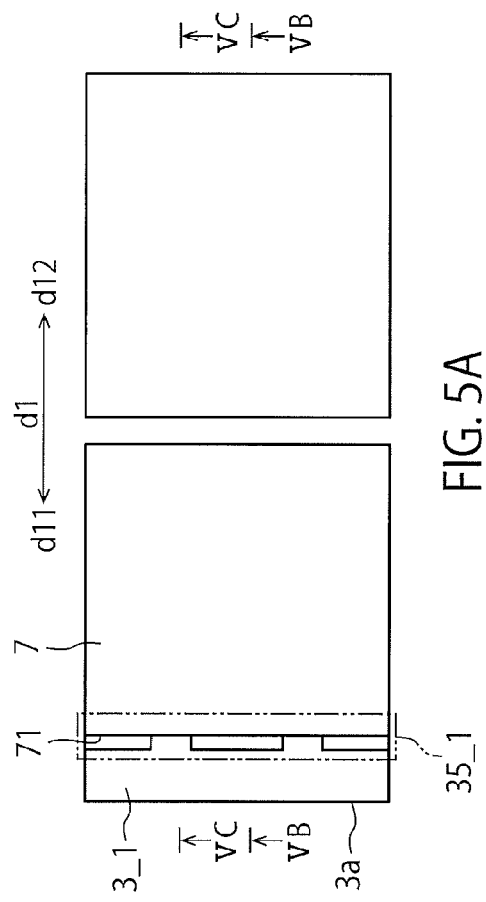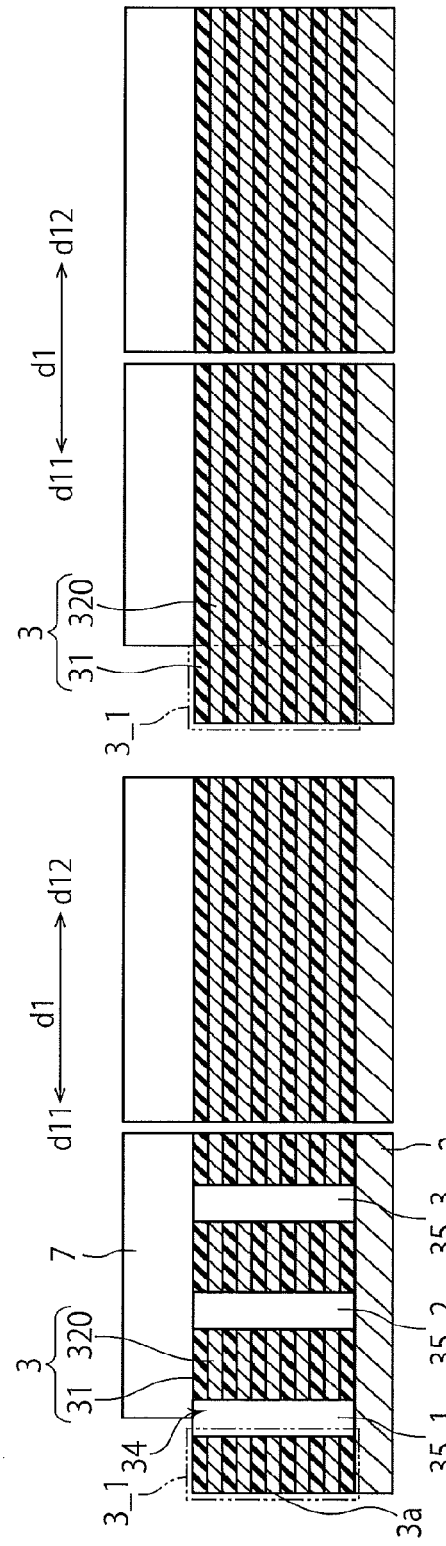
FIG. 5A
FIG. 5B
FIG. 5C

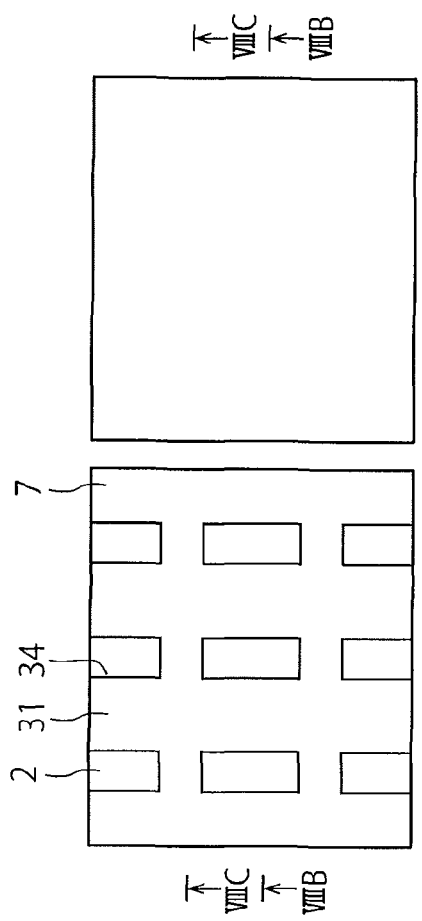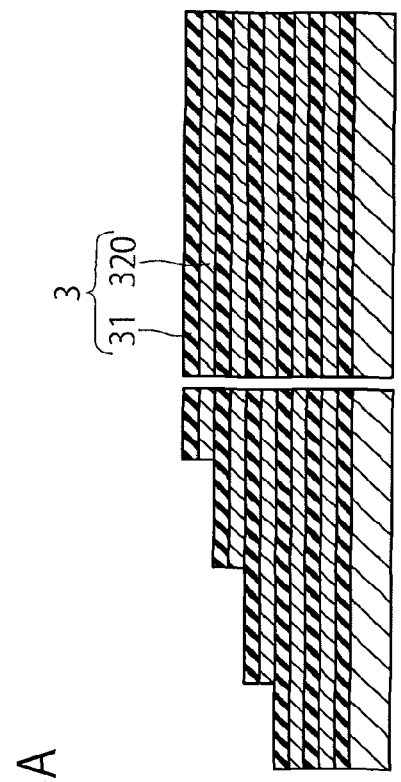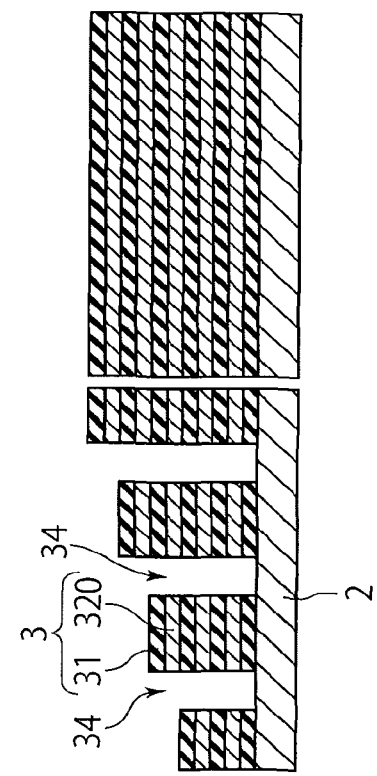

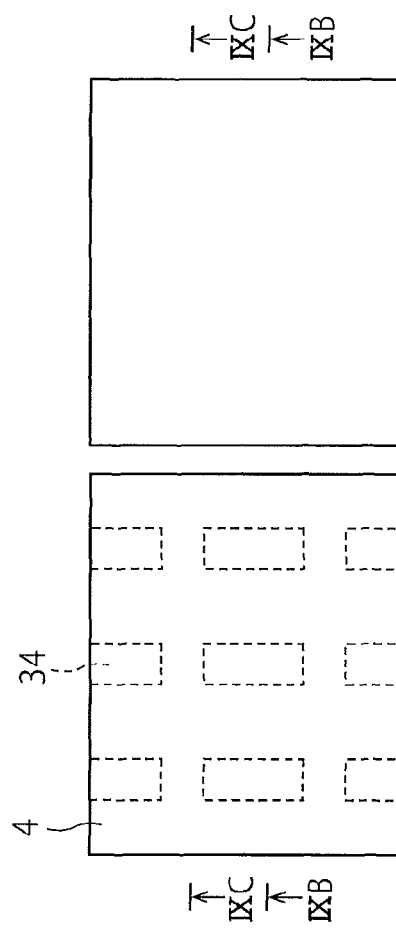
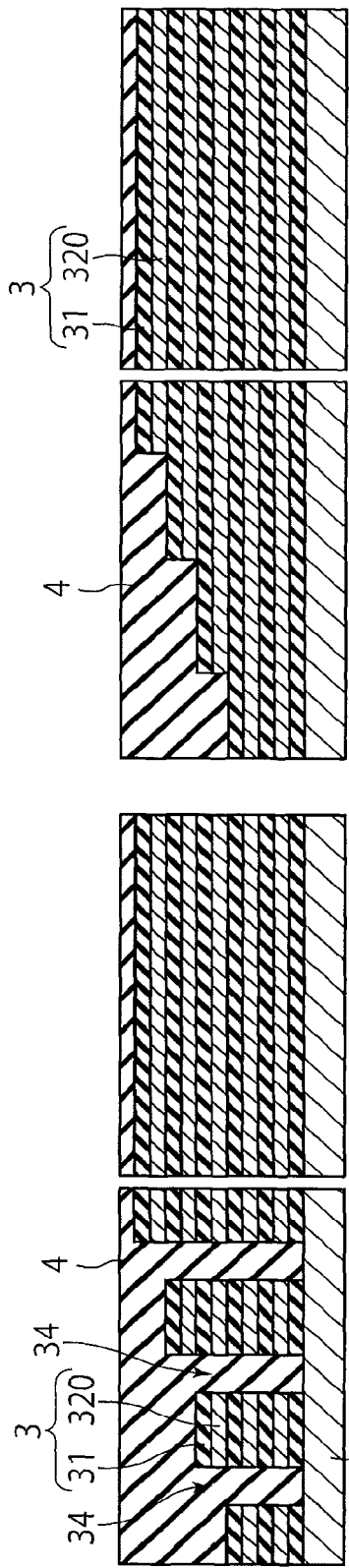
FIG. 9A
FIG. 9B
FIG. 9C

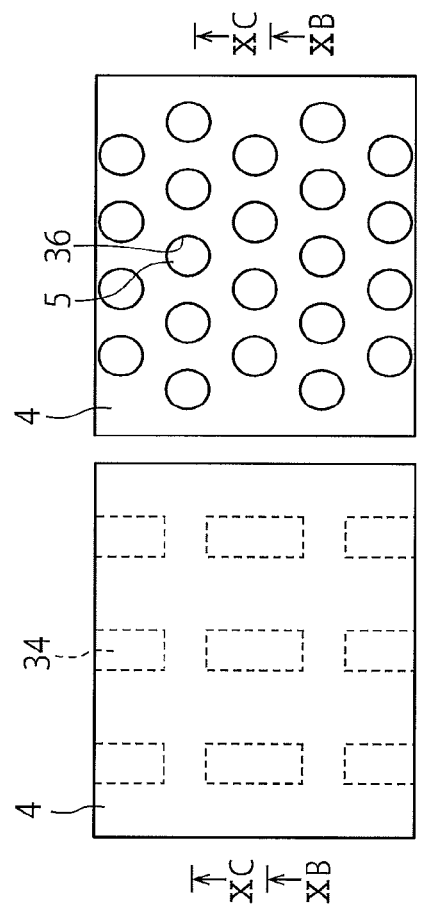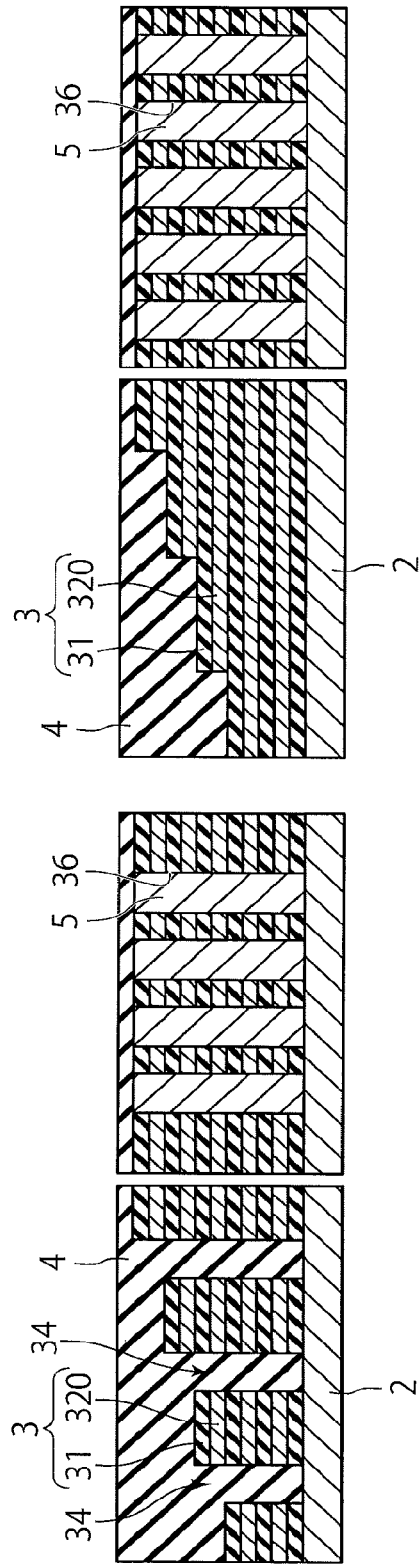
FIG. 10A
FIG. 10B
FIG. 10C

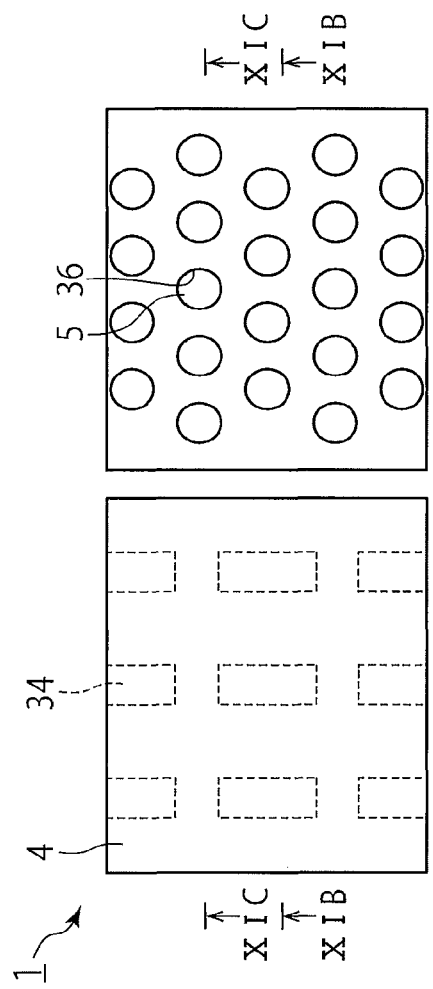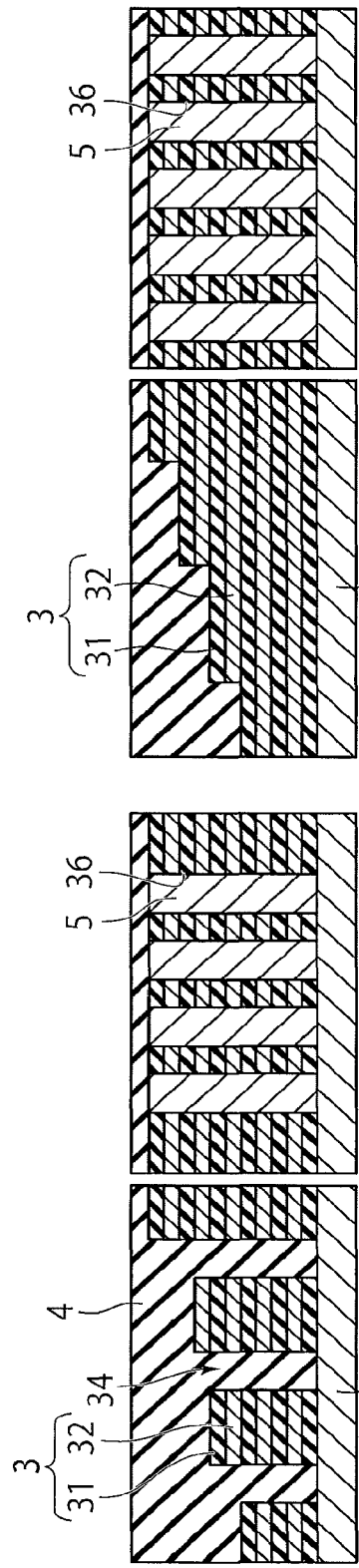
FIG. 11A
FIG. 11B
FIG. 11C

SEMICONDUCTOR MANUFACTURING METHOD AND SEMICONDUCTOR DEVICE

CROSS REFERENCE TO RELATED APPLICATIONS

This application is based upon and claims the benefit of priority from the prior U.S. Provisional Patent Application No. 62/279,110 filed on Jan. 15, 2016, the entire contents of which are incorporated herein by reference.

FIELD

The embodiments of the present invention relate to a semiconductor manufacturing method and a semiconductor device.

BACKGROUND

A three-dimensional stack memory includes a stack film having conductive films that function as word lines (that is, control gates) of memory cells and insulating films alternately stacked, memory holes passing through the stack film, and MA(O)NOS structures placed in the memory holes, respectively. A part of the stack film is a stepped portion processed in a stepped shape. Contact electrodes that connect the conductive films in respective steps of the stepped portion to upper wires are provided on the steps.

A dry etching technique called resist slimming is known as a technique to form the stepped portion. In the resist slimming, each time an exposed portion of the stack film is ground by one step by dry etching using a resist as a mask, the resist is diminished in an extension direction of the word lines by the dry etching. A newly exposed portion including the previous exposed portion is then ground by one step using the diminished resist as a mask. Such diminishment of the resist and etching of the stack film using the diminished resist as a mask are repeated to obtain the stepped portion.

However, it is conventionally difficult to ensure dimensional accuracies in the respective steps of the stepped portion in the extension direction of the word lines due to a factor such as variation in the elimination amount of the resist in the resist slimming. Because it is difficult to ensure the dimensional accuracies in the respective steps of the stepped portion, positional accuracies in the contact electrodes on the respective steps are hard to ensure. Accordingly, there is a risk that a contact electrode provided on a lower step is brought into contact with a conductive film of an upper step and thus upper and lower conductive films are short-circuited, which leads to a lower yield ratio.

BRIEF DESCRIPTION OF THE DRAWINGS

FIG. 1A is a plan view schematically showing a semiconductor storage device as an example of a semiconductor device according to an embodiment, FIG. 1B is a sectional view along a line IB-IB in FIG. 1A, and FIG. 1C is a sectional view along a line IC-IC in FIG. 1A;

FIG. 2A is a plan view schematically showing a semiconductor manufacturing method according to the embodiment, FIG. 2B is a sectional view along a line IIB-IIB in FIG. 2A, and FIG. 2C is a sectional view along a line IIC-IIC in FIG. 2A;

FIG. 3A is a plan view schematically showing a semiconductor manufacturing method according to the embodiment following FIGS. 2A to 2C, FIG. 3B is a sectional view along a line IIIB-IIIB in FIG. 3A, and FIG. 3C is a sectional view along a line IIIC-IIIC in FIG. 3A;

FIG. 4A is a plan view schematically showing a semiconductor manufacturing method according to the embodiment following FIGS. 3A to 3C, FIG. 4B is a sectional view along a line IVB-IVB in FIG. 4A, and FIG. 4C is a sectional view along a line IVC-IVC in FIG. 4A;

FIG. 5A is a plan view schematically showing a semiconductor manufacturing method according to the embodiment following FIGS. 4A to 4C, FIG. 5B is a sectional view along a line VB-VB in FIG. 5A, and FIG. 5C is a sectional view along a line VC-VC in FIG. 5A;

FIG. 8A is a plan view schematically showing a semiconductor manufacturing method according to the embodiment following FIGS. 7A to 7C, FIG. 8B is a sectional view along a line VIIIB-VIIIB in FIG. 8A, and FIG. 8C is a sectional view along a line VIIIC-VIIIC in FIG. 8A;

FIG. 9A is a plan view schematically showing a semiconductor manufacturing method according to the embodiment following FIGS. 8A to 8C, FIG. 9B is a sectional view along a line IXB-IXB in FIG. 9A, and FIG. 9C is a sectional view along a line IXC-IXC in FIG. 9A;

FIG. 10A is a plan view schematically showing a semiconductor manufacturing method according to the embodiment following FIGS. 9A to 9C, FIG. 10B is a sectional view along a line XB-XB in FIG. 10A, and FIG. 10C is a sectional view along a line XC-XC in FIG. 10A;

FIG. 11A is a plan view schematically showing a semiconductor manufacturing method according to the embodiment following FIGS. 10A to 10C, FIG. 11B is a sectional view along a line XIB-XIB in FIG. 11A, and FIG. 11C is a sectional view along a line XIC-XIC in FIG. 11A.

DETAILED DESCRIPTION

Figure 6A:
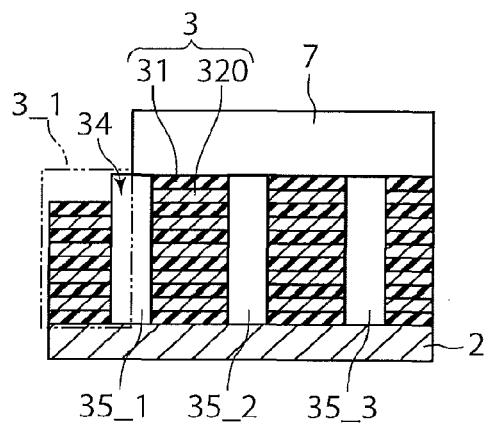
FIG. 6A is a sectional view schematically showing a semiconductor manufacturing method according to the embodiment following FIGS. 5A to 5C.

A semiconductor manufacturing method according to an embodiment includes alternately stacking first films and second films to form a stack film. The semiconductor manufacturing method includes forming a plurality of recessed portions in a stack direction of the stack film at an interval in a first direction substantially perpendicular to the stack direction. The semiconductor manufacturing method includes forming third films in the recessed portions, respectively. The semiconductor manufacturing method includes forming a mask material on the stack film and the third films and diminishing the mask material in the first direction to expose the stack film in a first range between an end of a stepped portion to be formed on the stack film and one of the third films and to position an end of the mask material on the third film. The semiconductor manufacturing method includes removing a predetermined number of layers of films from the stack film in the first range using the diminished mask material as a mask to form the stepped portion on the stack film.

Embodiments will now be explained with reference to the accompanying drawings. The present invention is not limited to the embodiments.

FIG. 1A is a plan view schematically showing a semiconductor storage device 1 as an example of a semiconductor device according to an embodiment. FIG. 1B is a sectional view along a line IB-IB in FIG. 1A. FIG. 1C is a sectional view along a line IC-IC in FIG. 1A.

The semiconductor storage device 1 according to the present embodiment can be applied to, for example, a three-dimensional stack memory.

The semiconductor storage device 1 includes a semiconductor substrate 2, a stack film 3, a fourth film 4, memory strings 5 as an example of storage portions, and contact electrodes 6 as an example of connection portions.

(Stack Film 3)

The stack film 3 is placed on the semiconductor substrate 2. The stack film 3 includes insulating films 31 as an example of first films and conductive films 32 as an example of second films. The insulating films 31 and the conductive films 32 are stacked alternately and repeatedly. As described later, the conductive films 32 are films with which silicon nitride films 320 (see FIGS. 2A to 10C) are replaced after the memory strings 5 are formed.

The insulating films 31 are silicon oxide films, for example. The conductive films 32 each include a tungsten film, for example. The conductive films 32 each can further include a TiN film being in contact with the tungsten film to grow tungsten, and an A10 film being in contact with the TiN film and the insulating films 31 to function as a block film. The conductive films 32 can function as word lines or select gate lines.

The stack film 3 has a stepped portion 33 obtained by processing the stack film 3 in a stepped shape at an end on one side d11 in an extension direction d1 (that is, row direction) of the conductive films 32 being an example of a first direction. The extension direction d1 is perpendicular to a stack direction d3 of the stack film 3. Steps 331_1 to 331_4 (that is, terraces) of the stepped portion 33 have differences in levels in the stack direction d3 and are adjacent in the extension direction d1. Heights of the steps 331_1 to 331_4 of the stepped portion 33 are lowered toward the one side d11 in the extension direction d1. In the example shown in FIGS. 1B and 1C, the differences in levels between adjacent ones of the steps 331_1 to 331_4 correspond to a film thickness of two layers of the insulating film 31 and the conductive film 32. The differences in levels between adjacent ones of the steps 331_1 to 331_4 are not limited to the film thickness of two layers and can be a film thickness of three or more layers depending on the layout design.

As shown in FIG. 1A, recessed portions 34 in a substantially quadrangular prism shape passing through the stack film 3 in the stack direction d3 are located at boundary positions $B_{1-2}$, $B_{2-3}$, and $B_{3-4}$ between adjacent ones of the steps 331_1 to 331_4, respectively. To prevent the conductive films 32 from being completely separated by the recessed portions 34 in the extension direction d1, the recessed portions 34 are divided into a plurality of parts at an interval in a width direction d2 (that is, column direction)

orthogonal to the extension direction d1 and the stack direction d3. The width direction d2 is one example of a second direction.

To ensure the dimensional accuracy in a width W (hereinafter, also "terrace width") in the extension direction d1 of the respective steps 331_1 to 331_4 of the stepped portion 33, third films 35_1 to 35_3 (see FIGS. 4A and 4B) are formed in the recessed portions 34 before processing the stepped portion 33. A resist 7 (see FIG. 5) is diminished by photolithography or resist slimming processing using the third films 35_1 to 35_3 formed in the recessed portions 34 as indices and the stepped portion 33 is processed one step by one step by dry etching using the diminished resist 7 as a mask. The resist 7 is an example of a mask material.

The resist slimming processing is processing of diminishing, that is, setting back the resist 7 in the extension direction d1 in order to broaden a processing target range in the stack film 3 for the dry etching using the resist 7 as a mask to progress the processing of the stepped portion 33.

Details of the processing of the stepped portion 33 using the third films 35_1 to 35_3 as indices are saved for explanations of a semiconductor manufacturing method described later.

Because being processed by the photolithography or resist slimming processing using the third films 35_1 to 35_3 as indices, the dimensional accuracy in the terrace width W of the respective steps 331_1 to 331_4 is ensured.

(Fourth Film 4)

The fourth film 4 is placed in the recessed portions 34 and on the stack film 3. Because being placed in the recessed portions 34, the fourth film 4 extends through the stack film 3 at the boundary positions $B_{1-2}$, $B_{2-3}$, and $B_{3-4}$ between adjacent ones of the steps 331_1 to 331_4.

The fourth film 4 is an insulating film. To stably hold the insulating films 31 to prevent collapse of the stack film 3 during wet etching of the silicon nitride films 320 described later, the fourth film 4 preferably has a resistance property against a chemical of the wet etching. For example, the fourth film 4 can be a TEOS (Tetraethyl orthosilicate).

(Memory Strings 5)

The memory strings 5 are placed on the stack film 3 on the other side d12 in the extension direction d1 with respect to the stepped portion 33. As shown in FIG. 1A, the memory strings 5 are placed at an interval in the extension direction d1 and the width direction d2. The memory strings 5 are formed in a substantially columnar shape and are embedded in memory holes 36 passing through the stack film 3, respectively. The memory strings 5 each include a silicon pillar (polysilicon) and a charge accumulation layer surrounding the silicon pillar. The charge accumulation layer has, for example, a MONOS (Metal-Oxide-Nitride-Oxide-Silicon) structure or a MANOS (Metal-Al$_2$O$_3$-Nitride-Oxide-Silicon) structure.

(Contact Electrodes 6)

In the example of FIG. 1A, two contact electrodes 6 are placed at an interval in the width direction d2 on each of the steps 331_1 to 331_4. The number of the contact electrodes 6 for each of the steps 331_1 to 331_4 is not limited to two and can be variously changed according to the design.

The contact electrodes 6 are formed in a substantially columnar shape extending in the stack direction d3 of the stack film 3 and are embedded in holes 41 passing through the fourth film 4, respectively. Lower ends of the contact electrodes 6 pass through the insulating films 31 being topmost layers of the steps 331_1 to 331_4 to be connected to the conductive films 32 being the second top layers thereof, respectively. Upper ends of the contact electrodes 6 are connected to upper wires (not shown).

The contact electrodes 6 are placed at positions shifted in the width direction d2 from the recessed portions 34 so as not to be adjacent to the recessed portions 34 in the extension direction d1. Prevention of the contact electrodes 6 from being adjacent to the recessed portions 34 can suppress wiring lengths (that is, wiring resistances) of the conductive films 32 connected to the contact electrodes 6.

Due to the ensured dimensional accuracy in the terrace width W, the positional accuracies in the contact electrodes 6 are also ensured. Because the positional accuracies are ensured, the contact electrodes 6 are placed at appropriate positions on the steps 331_1 to 331_4 to be spaced apart from the conductive films 32 of the upper steps, respectively. Because the contact electrodes 6 can be placed to be spaced apart from the conductive films 32 of the upper steps, short-circuiting between upper and lower conductive films 32 via the contact electrodes 6 can be prevented and the yield ratio can be increased.

As the number of layers of the conductive films 32 is increased in order to increase the density of the semiconductor storage devices 1, the number of steps in the stepped portion 33 is increased. An increase in the number of steps in the stepped portion 33 narrows the terrace width W of the respective steps. Due to the narrowed terrace width W, it becomes more difficult to ensure the dimensional accuracy in the terrace width W and the possibility of the short-circuiting between the upper and lower conductive films 32 is further increased. Therefore, if the dimensional accuracy in the terrace width W cannot be ensured, the density of the semiconductor storage devices 1 is hard to increase. In contrast thereto, because the semiconductor storage device 1 according to the present embodiment includes the recessed portions 34 in which the third films 35_1 to 35_3 used as the indices for the photography and the resist slimming processing can be embedded, the dimensional accuracy can be ensured even when the terrace width W is narrow. Accordingly, with the semiconductor storage device 1 according to the present embodiment, the density can be reliably increased.

(Manufacturing Method)

A manufacturing method for manufacturing the semiconductor storage device 1 shown in FIG. 1 is explained next.

FIG. 2A is a plan view schematically showing a semiconductor manufacturing method according to the present embodiment. FIG. 2B is a sectional view along a line IIB-IIB in FIG. 2A. FIG. 2C is a sectional view along a line IIC-IIC in FIG. 2A.

In the present embodiment, the stack film 3 is formed, for example, by alternately stacking the silicon oxide films 31 and the silicon nitride films 320 on the semiconductor substrate 2 using a CVD (Chemical Vapor Deposition) method. After the stack film 3 is formed, the recessed portions 34 one fewer than steps of the stepped portion 33 to be formed are formed at an interval in the extension direction d1 at an end of the stack film 3 on the one side d11 in the extension direction d1 as shown in FIG. 2A. The number of the recessed portions 34 is not limited to a value one smaller than the number of the steps in the stepped portion 33 as long as the number of the recessed portions 34 is smaller than the number of the steps in the stepped portion 33.

At this time, as shown in FIG. 2A, the recessed portions 34 are formed over partial ranges of the stack film 3 in the width direction d2. More specifically, the recessed portions 34 are formed to be pluralities of divided parts spaced apart in the width direction d2, respectively. This can ensure regions in which the recessed portions 34 are not formed in the width direction d2 of the stack film 3 and thus complete separation (that is, break) of the conductive films 32 (see FIGS. 1B and 1C) of the respective steps 331_1 to 331_4 in the extension direction d1 by the recessed portions 34 can be avoided. Accordingly, electric characteristics of the conductive films 32 can be ensured.

The recessed portions 34 can be formed, for example, by reactive ion etching (RIE).

FIG. 3A is a plan view schematically showing a semiconductor manufacturing method according to the present embodiment following FIGS. 2A to 2C. FIG. 3B is a sectional view along a line IIIB-IIIB in FIG. 3A. FIG. 3C is a sectional view along a line IIIC-IIIC in FIG. 3A.

After the recessed portions 34 are formed, the third film 35 is formed as one piece extending in the recessed portions 34 and on the stack film 3 as shown in FIGS. 3A to 3C. A material of the third film 35 is not particularly limited as long as the material has a higher selectivity to a chemical to be used for wet etching of the third film 35 described later than the insulating films 31 and the silicon nitride films 320. The third film 35 can be, for example, at least one of a-Si (amorphous silicon), Poly-Si (polysilicon), W, Ni, Cu, Mo, Ti, and TiN.

FIG. 4A is a plan view schematically showing a semiconductor manufacturing method according to the present embodiment following FIGS. 3A to 3C. FIG. 4B is a sectional view along a line IVB-IVB in FIG. 4A. FIG. 4C is a sectional view along a line IVC-IVC in FIG. 4A.

After the third film 35 is formed in the recessed portions 34 and on the stack film 3, the third film 35 on the stack film 3 is removed while only the third films 35_1 to 35_3 in the recessed portions 34 are left as shown in FIGS. 4A to 4C. Accordingly, the third films 35_1 to 35_3 independent in the respective recessed portions 34 are formed and upper surfaces of the third films 35_1 to 35_3 become flush with an upper surface of the stack film 3.

The third film 35 on the stack film 3 can be removed, for example, by planarization processing such as CMP (Chemical Mechanical Polishing) or dry etching (that is, etching back).

The dimension of the third films 35_1 to 35_3 (that is, the recessed portions 34) in the extension direction d1 can be changed according to a required dimensional accuracy in the terrace width W. For example, when the terrace width W of the steps 331_1 to 331_4 needs to be narrowed because the memory density is higher and the number of steps in the stepped portion 33 is larger, a high dimensional accuracy is demanded for the terrace width W from the viewpoint of appropriately forming the contact electrodes 6 on the respective steps 331_1 to 331_4. In this case, to obtain a desired terrace width W, the width of the third films 35_1 to 35_3 in the extension direction d1 can be narrowed as compared to a case where the number of steps in the stepped portion 33 is smaller.

FIG. 5A is a plan view schematically showing a semiconductor manufacturing method according to the present embodiment following FIGS. 4A to 4C. FIG. 5B is a sectional view along a line VB-VB in FIG. 5A. FIG. 5C is a sectional view along a line VC-VC in FIG. 5A.

After the third film 35 on the stack film 3 is removed, the resist 7 is formed (coated) all over the stack film 3 and the third films 35_1 to 35_3. The resist 7 is then patterned by photolithography as shown in FIGS. 5A to 5C.

Specifically, the resist 7 is diminished in the extension direction d1 to cause the stack film 3 to be exposed from the resist 7 in a first processing target range 3_1 (that is, first range) between an end 3a of the stack film 3 on the one side d11 and the first third film 35_1 and also to position an end 71 (hereinafter, also "resist end") of the resist 7 in the extension direction d1 on the first third film 35_1. The end 3a on the one side d11 of the stack film 3 becomes an end of the stepped portion 33 to be formed. The end 3a can be present at a stage of processing the stepped portion 33 or can be formed at a stage of segmentation into the individual semiconductor storage devices 1. When the end 3a is not actually present at the stage of processing the stepped portion 33, the resist 7 can be processed based on a designed position of the end 3a.

If the third film 35_1 is not present, it is difficult to ensure the positional accuracy in the resist end 71 due to variation in superposition of a mask or dimensional variation according to a focus or an exposure amount of an exposure device. In contrast thereto, in the present embodiment, the resist end 71 can be positioned on the third film 35_1 by photolithography using the third film 35_1 as an index (that is, alignment mark for mask superposition). In this manner, the positional accuracy in the resist end 71 can be ensured.

The position of the resist end 71 can be any position as long as it is on the third film 35_1. By setting a certain allowable range according to the dimension of the third film 35_1 in the extension direction d1 to the position of the resist end 71, a certain level of process margin can be provided while the positional accuracy is ensured.

FIG. 6A is a sectional view schematically showing a semiconductor manufacturing method according to the present embodiment following FIGS. 5A to 5C.

After the resist 7 is patterned, first processing of the stepped portion 33 is performed as shown in FIG. 6A. In the first processing of the stepped portion 33, one of the insulating films 31 being the topmost layer and one of the silicon nitride films 320 being the underlying layer are removed from the first processing target range 3_1 by dry etching using the resist 7 as a mask.

Figure 6B:
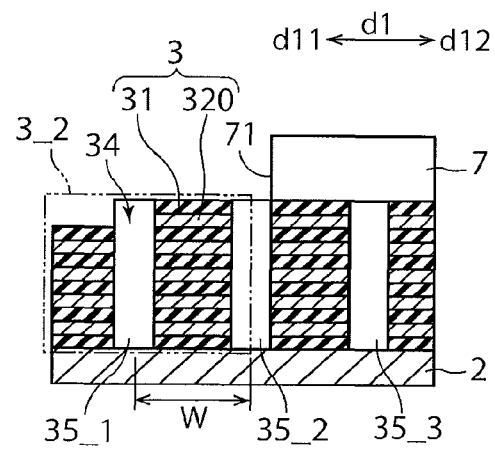
FIG. 6B is a sectional view showing a semiconductor manufacturing method following FIG. 6A.

FIG. 6B is a sectional view showing a semiconductor manufacturing method following FIG. 6A. After the first processing of the stepped portion 33, first resist slimming processing is performed as shown in FIG. 6B.

In the first resist slimming processing, the resist 7 is diminished in the extension direction d1 to a position where the stack film 3 is exposed in a second processing target range 3_2 between the end of the stack film 3 on the one side d11 and the second third film 35_2 and the resist end 71 is positioned on the second third film 35_2. The second processing target range 3_2 includes the first processing target range 3_1 and is enlarged to the other side d12 of the extension direction d1 by a unit terrace width W relative to the first processing target range 3_1.

The first resist slimming processing is dry etching in a state where plasma is produced and is performed until an exposed state of the second third film 35_2 is detected. An etching gas includes oxygen and fluorine. For example, a gas such as $SF_6$ or $NF_3$ can be used.

The exposed state of the third film 35_2 can be detected, for example, as a change in emission intensity of plasma based on a change of reaction by-products. Alternatively, the exposed state of the third film 35_2 can be detected based on a plasma potential Vpp.

Figure 6C:
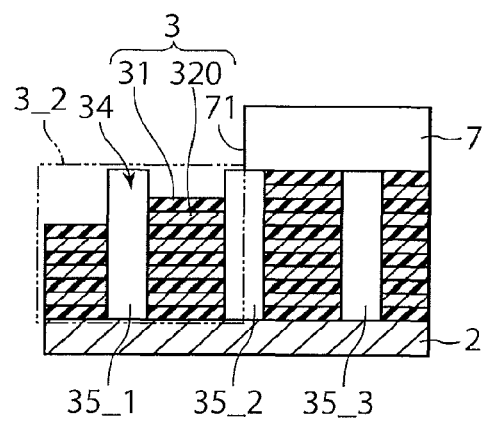
FIG. 6C is a sectional view showing a semiconductor manufacturing method following FIG. 6B.

FIG. 6C is a sectional view showing a semiconductor manufacturing method following FIG. 6B. After the first resist slimming processing, second processing of the stepped portion 33 is performed as shown in FIG. 6C. In the second processing of the stepped portion 33, one of the insulating films 31 as the topmost layer and one of the silicon nitride films 320 as the underlying layer are removed from each of the steps in the second processing target range 3_2 by dry etching using the resist 7 diminished by the first resist slimming processing as a mask.

Figure 6D:
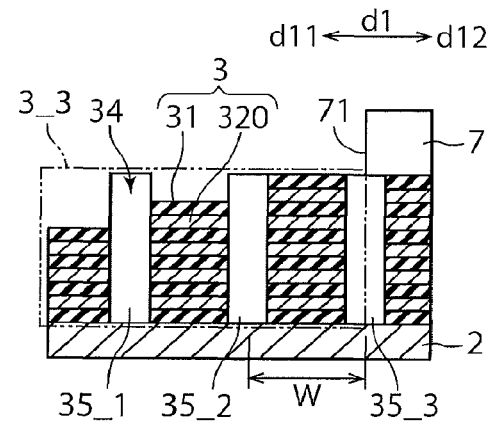
FIG. 6D is a sectional view showing a semiconductor manufacturing method following FIG. 6C.

FIG. 6D is a sectional view showing a semiconductor manufacturing method following FIG. 6C. After the second processing of the stepped portion 33, second resist slimming processing is performed as shown in FIG. 6D. In the second resist slimming processing, the resist 7 is diminished in the extension direction d1 to a position where the stack film 3 is exposed in a third processing target range 3_3 between the end of the stack film 3 on the one side d11 and the third third film 35_3 and the resist end 71 is positioned on the third third film 35_3. The third processing target range 3_3 includes the second processing target range 3_2 and is enlarged to the other side d12 of the extension direction d1 by the unit terrace width W relative to the second processing target range 3_2.

Also the second resist slimming processing is the dry etching in a state where plasma is produced and is performed until an exposed state of the third third film 35_3 is detected.

Figure 7A:
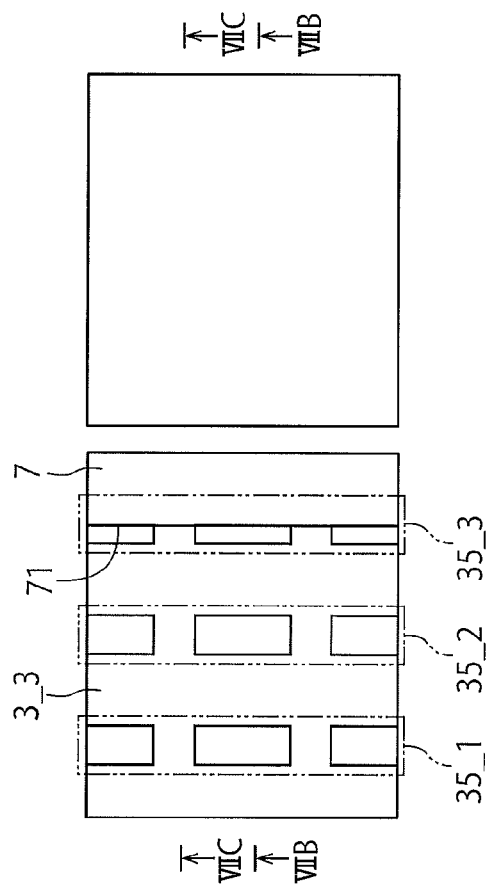
FIG. 7A is a plan view schematically showing a semiconductor manufacturing method according to the embodiment following FIG. 6D.
Figure 7C:
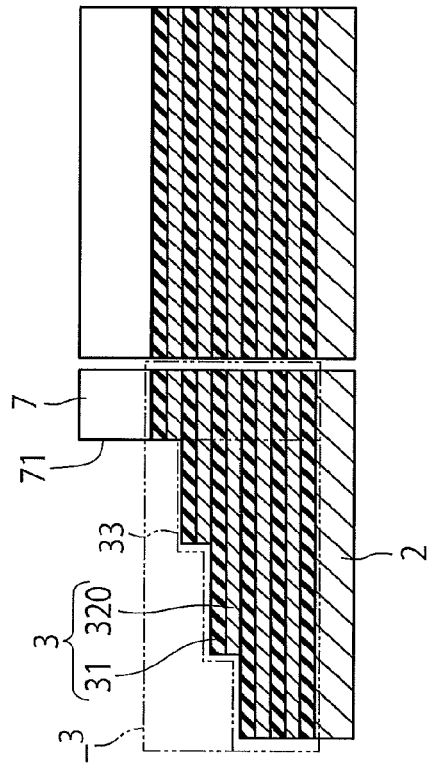
FIG. 7C is a sectional view along a line VIIC-VIIC in FIG. 7A.
Figure 7B:
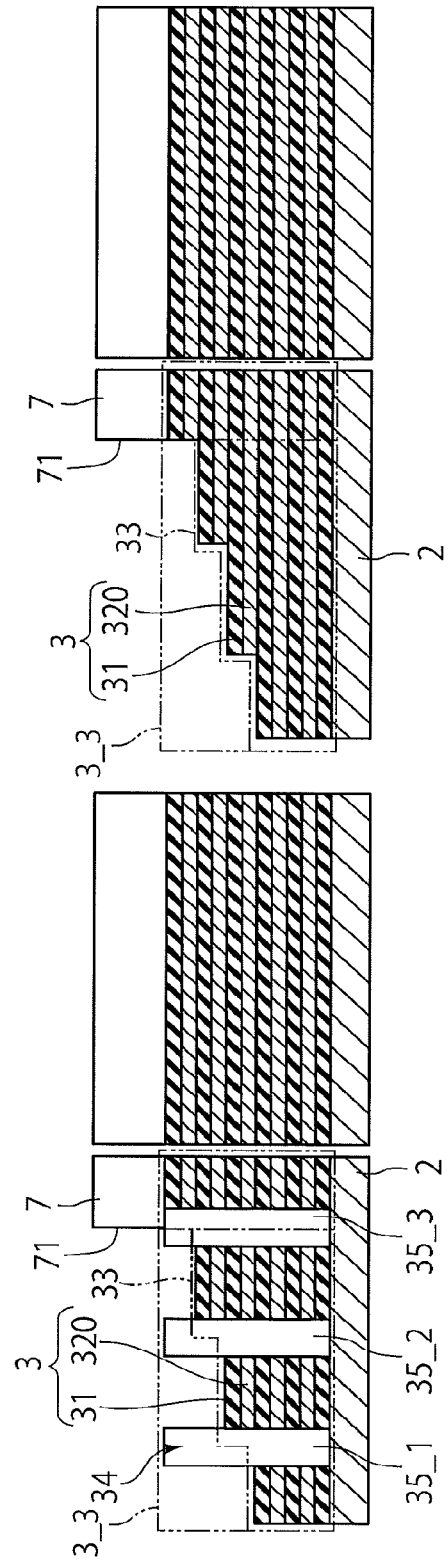
FIG. 7B is a sectional view along a line VIIB-VIIB in FIG. 7A.

FIG. 7A is a plan view schematically showing a semiconductor manufacturing method according to the present embodiment following FIG. 6D. FIG. 7B is a sectional view along a line VIIB-VIIB in FIG. 7A. FIG. 7C is a sectional view along a line VIIC-VIIC in FIG. 7A.

After the second resist slimming processing, third processing of the stepped portion 33 is performed as shown in FIGS. 7A to 7C. In the third processing of the stepped portion 33, one of the insulating films 31 as the topmost layer and one of the silicon nitride films 320 as the underlying layer are removed from each of the steps in the third processing target range 3_3 by dry etching using the resist 7 diminished by the second resist slimming processing as a mask.

In this manner, the stepped portion 33 is obtained by performing the diminishment of the resist 7 and the removal of the films 31 and 320 from a processing target range the number of times one smaller than the number of steps in the stepped portion 33 while enlarging the processing target ranges 3_1 to 3_3 in the extension direction d1.

While the stepped portion 33 having the three third films 35_1 to 35_3 and the four steps is shown in FIGS. 7A to 7C, these are merely an example of the present embodiment illustrated in a simplified manner. The number of the third films 35_1 to 35_3 and the number of steps in the stepped portion 33 can practically be larger than those shown in FIGS. 7A to 7C.

If the third films 35_2 and 35_3 are not present, in order to recognize the position of the resist end 71, the film thickness of the resist 7 decreasing at the time of the resist slimming processing is measured and the amount of slimming of the resist 7 in the extension direction d1 is predicted based on the measured film thickness, for example. The position of the resist end 71 is then recognized based on the predicted amount of slimming. However, the position of the resist end 71 recognized by this method is low in the accuracy because it is indirectly recognized based on the film thickness. Furthermore, because the amount of slimming of the resist 7 varies according to a state of depositions remaining in a chamber, a usage state of chamber parts, and the like, the position of the resist end 71 recognized based on the predicted amount of slimming is further lowered in the accuracy.

In contrast thereto, in the present embodiment, the fact that the resist end 71 is located on the third films 35_1 to 35_3 can be accurately detected at the time of the resist slimming processing based on the exposed state of the third film 35. Accordingly, the positional accuracy in the resist end 71 can be ensured.

FIG. 8A is a plan view schematically showing a semiconductor manufacturing method according to the present embodiment following FIGS. 7A to 7C. FIG. 8B is a sectional view along a line VIIIB-VIIIB in FIG. 8A. FIG. 8C is a sectional view along a line VIIIC-VIIIC in FIG. 8A.

After the stepped portion 33 is formed, the third films 35_1 to 35_3 are removed from the recessed portions 34 as shown in FIGS. 8A and 8B. The third films 35_1 to 35_3 are removed by wet etching using a chemical. Due to the removal of the third films 35_1 to 35_3, the recessed portions 34 are formed again.

FIG. 9A is a plan view schematically showing a semiconductor manufacturing method according to the present embodiment following FIGS. 8A to 8C. FIG. 9B is a sectional view along a line IXB-IXB in FIG. 9A. FIG. 9C is a sectional view along a line IXC-IXC in FIG. 9A.

After the third films 35_1 to 35_3 are removed, the fourth film 4 is formed in the recessed portions 34 and on the stack film 3 as shown in FIGS. 9A to 9C. The fourth film 4 can be formed, for example, by the CVD method.

FIG. 10A is a plan view schematically showing a semiconductor manufacturing method according to the present embodiment following FIGS. 9A to 9C. FIG. 10B is a sectional view along a line XB-XB in FIG. 10A. FIG. 10C is a sectional view along a line XC-XC in FIG. 10A.

After the fourth film 4 is formed, memory holes 36 are formed at positions different from that of the stepped portion 33 in the stack film 3 and the memory strings 5 are formed in the memory holes 36, respectively, as shown in FIGS. 10A to 10C. The memory holes 36 can be formed, for example, by reactive ion etching. The memory strings 5 can be formed, for example, by the CVD method.

FIG. 11A is a plan view schematically showing a semiconductor manufacturing method according to the present embodiment following FIGS. 10A to 10C. FIG. 11B is a sectional view along a line XIB-XIB in FIG. 11A. FIG. 11C is a sectional view along a line XIC-XIC in FIG. 11A.

After the memory strings 5 are formed, the silicon nitride films 320 are replaced with the conductive films 32, respectively, as shown in FIGS. 11A to 11C. For replacement with the conductive films 32, the silicon nitride films 320 are selectively removed from the stack film 3 to form voids between respective layers of the insulating films 31. The voids are formed by wet etching of bringing a chemical into contact with the silicon nitride films 320 through trenches (not shown) formed in the stack film 3. The chemical can be, for example, a heated phosphoric acid solution. Because the selectivity of the chemical is high, the fourth film 4 is not removed by the wet etching. Due to being not removed by the wet etching, the fourth film 4 can stably hold the stack film 3 (that is, multilayer structure of the insulating films 31) that has been weakened by formation of the voids. Accordingly, collapse of the stack film 3 can be prevented and the yield ratio can be increased.

After the voids are formed, an A10 film, a TiN film, and a tungsten film are formed in this order on inner walls of the voids to form the conductive films 32.

After the replacement with the conductive films 32, the contact electrodes 6 are formed on the respective steps of the stepped portion 33 as shown in FIGS. 1A to 1C. To form the contact electrodes 6, the holes 41 passing through the fourth film 4 and the silicon oxide films 31 are formed and the contact electrodes 6 are embedded in the formed holes 41.

The holes 41 can be formed, for example, by etching using a resist. The contact holes 6 can be formed, for example, by the CVD method.

Because the stepped portion 33 is formed by the photolithography and the resist slimming processing using the third films 35_1 to 35_3 as the indices, the dimensional accuracy in the terrace width W of the respective steps 331_1 to 331_4 of the stepped portion 33 is ensured. The ensured dimensional accuracy in the terrace width W enables the contact electrodes 6 to be formed on the respective steps 331_1 to 331_4 with a high positional accuracy. Because the positional accuracies in the contact electrodes 6 are ensured, the contact electrodes 6 are not in contact with the conductive films 32 of the upper steps. Accordingly, short-circuiting between upper and lower conductive films 32 through the contact electrodes 6 can be prevented.

As described above, according to the present embodiment, the stepped portion 33 can be processed using the third films 35_1 to 35_3 in the recessed portions 34 as the indices for the position of the resist end 71. Therefore, the dimensional accuracy in the terrace width W and the positional accuracies in the contact electrodes 6 can be ensured. This can prevent short-circuiting between upper and lower conductive films 32 to increase the yield ratio.

(Modification)

An example in which damages on the semiconductor substrate 2 at the time of removing the third film 35 are suppressed is explained as a modification of the present embodiment. In the present modification, constituent parts corresponding to those in the semiconductor storage device 1 shown in FIG. 1 are denoted by like reference characters and redundant explanations thereof will be omitted.

Figure 12A:
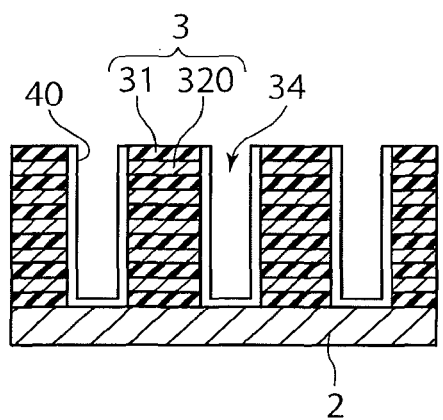
FIG. 12A is a sectional view schematically showing a semiconductor manufacturing method according to a modification.

FIG. 12A is a sectional view schematically showing a semiconductor manufacturing method according to the present modification. In the present modification, after the recessed portions 34 are formed in the stack film 3, a spacer film 40 such as an oxide film is formed on inner surfaces of the recessed portions 34, that is, on side walls of the stack film 3 and an upper surface of the semiconductor substrate 2 as shown in FIG. 12A. A thickness of the spacer film 40 is suppressed to such a level that sufficient spaces for forming the third films 35_1 to 35_3 in the recessed portions 34 are left. A material of the spacer film 40 can be the same as that of the fourth film 4.

Figure 12B:
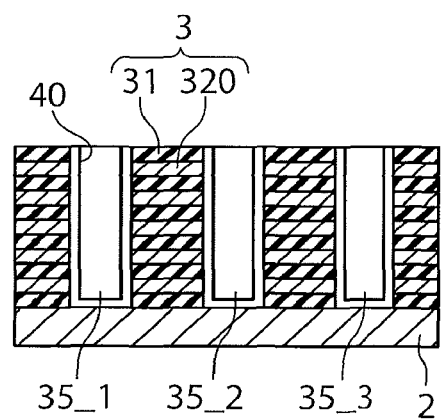
FIG. 12B is a sectional view showing a semiconductor manufacturing method following FIG. 12A.

FIG. 12B is a sectional view showing a semiconductor manufacturing method following FIG. 12A. After the spacer film 40 is formed, the third films 35_1 to 35_3 are formed in the recessed portions 34 in which the spacer film 40 has been formed, respectively, as shown in FIG. 12B.

Figure 12C:
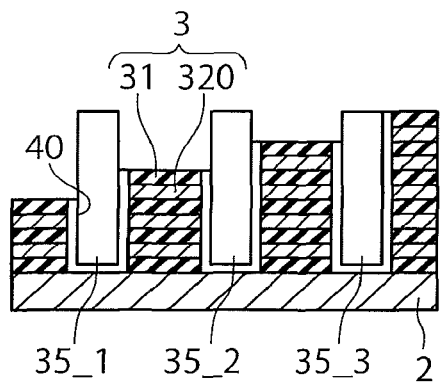
FIG. 12C is a sectional view showing a semiconductor manufacturing method following FIG. 12B.

FIG. 12C is a sectional view showing a semiconductor manufacturing method following FIG. 12B. As shown in FIG. 12C, when the stepped portion 33 is processed using the third films 35_1 to 35_3 as the indices for the position of the resist end 71, the spacer film 40 is dry etched together with the silicon oxide films 31 and the silicon nitride films 320.

Figure 12D:
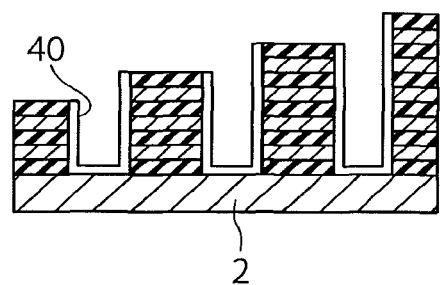
FIG. 12D is a sectional view showing a semiconductor manufacturing method following FIG. 12C.

FIG. 12D is a sectional view showing a semiconductor manufacturing method following FIG. 12C. When the third films 35_1 to 35_3 are removed after the stepped portion 33 is formed, the spacer film 40 can prevent the semiconductor substrate 2 from being exposed to a chemical.

According to the present embodiment, damages on the semiconductor substrate 2 during removal of the third films 35_1 to 35_3 can be avoided and thus the yield ratio can be further increased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method comprising:
alternately stacking first films and second films to form a stack film;
forming a plurality of recessed portions in a stack direction of the stack film at an interval in a first direction substantially perpendicular to the stack direction;
forming third films in the recessed portions, respectively;
forming a mask material on the stack film and the third films and diminishing the mask material in the first direction to expose the stack film in a first range between an end of a stepped portion to be formed on the stack film and one of the third films and to position an end of the mask material on the third film; and
removing a predetermined number of layers of films from the stack film in the first range using the diminished mask material as a mask to form the stepped portion on the stack film.

2. The method of claim 1, wherein
diminishing of the mask material is repeatedly performed while changing the third film on which the end of the mask material is positioned in a direction of enlarging the first range each time the films are removed, and
removing of the films is repeatedly performed using the diminished mask material as a mask each time the mask material is diminished.

3. The method of claim 2, wherein diminishing of the mask material and removing of the films are performed a predetermined number of times fewer than steps in the stepped portion.

4. The method of claim 1, wherein forming of the recessed portions is performed at an interval corresponding to widths in the first direction of the steps in the stepped portion, respectively.

5. The method of claim 1, wherein numbers of the formed recessed portions and the formed third films are smaller than number of the steps in the stepped portion.

6. The method of claim 1, wherein forming of the recessed portions is performed over partial ranges of the stack film in a second direction orthogonal to the first direction and the stack direction.

7. The method of claim 6, wherein during forming of the recessed portions, the recessed portions are formed to be divided into pluralities of parts at an interval in the second direction, respectively.

8. The method of claim 1, wherein
forming of the third films comprises:
forming a third film as one piece in the recessed portions and on the stack film; and
removing a part of the third film on the stack film.

9. The method of claim 1, wherein diminishing of the mask material is performed until an exposed state of one of the third films is detected.

10. The method of claim 9, wherein
diminishing of the mask material is performed by dry etching in a state where plasma is produced, and
the exposed state of one of the third films is detected based on a plasma emission state or a plasma potential.

11. The method of claim 1, comprising removing the third films after forming the stepped portion.

12. The method of claim 11, comprising forming a fourth film in the recessed portions and on the stack film after removing the third films.

13. The method of claim 1, comprising forming storage portions extending in the stack direction at positions different from that of the stepped portion after forming the stepped portion.

14. The method of claim 13, wherein
the first films are insulating films, and
the second films are silicon nitride films.

15. The method of claim 14, comprising replacing the second films being the silicon nitride films with conductive films after forming the storage portions.

16. The method of claim 15, comprising forming connection portions connecting the conductive films in steps of the stepped portion to upper wires on the steps, respectively, after replacing the second films with the conductive films.

* * * * *